(12) United States Patent  
Rosenthal et al.

(10) Patent No.: US 9,330,706 B1  
(45) Date of Patent: *May 3, 2016

(54) WRITE ONCE READ FOREVER ARCHIVAL DATA STORAGE

(71) Applicants: Eric Dean Rosenthal, Morganville, NJ (US); Richard Jay Solomon, Monson, MA (US); Clark Eugene Johnson, Madison, WI (US); Brian David Solomon, Monson, MA (US); Jonathan Michael Smith, Princeton, NJ (US)

(72) Inventors: Eric Dean Rosenthal, Morganville, NJ (US); Richard Jay Solomon, Monson, MA (US); Clark Eugene Johnson, Madison, WI (US); Brian David Solomon, Monson, MA (US); Jonathan Michael Smith, Princeton, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/121,635

(22) Filed: Sep. 30, 2014

(51) Int. Cl.  
*G11B 7/0065* (2006.01)  
*G11B 7/257* (2013.01)  
*G11B 7/258* (2013.01)  
*G11C 13/04* (2006.01)  
*G03H 1/04* (2006.01)  
*G11B 7/00* (2006.01)

(52) U.S. Cl.  
CPC .............. *G11B 7/257* (2013.01); *G11B 7/0065* (2013.01); *G11B 7/258* (2013.01); *G11C 13/045* (2013.01); *G03H 2001/0417* (2013.01); *G03H 2260/16* (2013.01); *G11B 2007/0009* (2013.01); *G11B 2007/00656* (2013.01); *G11B 2220/218* (2013.01)

(58) Field of Classification Search  
None  
See application file for complete search history.

(56) References Cited

U.S. PATENT DOCUMENTS

| | | | |
|---|---|---|---|
| 3,560,210 A * | 2/1971 | Grobin | 430/1 |
| 4,202,695 A | 5/1980 | Philippaerts et al. | |
| 4,587,533 A * | 5/1986 | Nakane et al. | 369/275.1 |
| 4,720,447 A * | 1/1988 | De Keyzer et al. | 430/244 |
| 4,835,090 A * | 5/1989 | Sawyer | 430/367 |
| 5,449,597 A * | 9/1995 | Sawyer | 430/523 |
| 8,891,344 B1 * | 11/2014 | Rosenthal et al. | 369/103 |

* cited by examiner

Primary Examiner — Brian Butcher (57) ABSTRACT

This invention teaches a methodology and an optical apparatus that provides long-term, archival storage using a chemically stable, high-resolution, photosensitive emulsion, such as silver halide, for the long-term, archival storage and retrieval of data, images and text. Multiple state data substantially increasing data density is stored as vertical diffraction gratings in the archival photosensitive emulsion. The data can be read out in parallel, substantially increasing retrieval speeds beyond that of current optical and magnetic techniques.

4 Claims, 7 Drawing Sheets

WRITE ONCE READ FOREVER ARCHIVAL DATA STORAGE

RELATED APPLICATIONS

The present application is a continuation in part of U.S. application Ser. No. 13/506,970, filed on May 29, 2012, now U.S. Pat. No. 8,891,344 which in turn claims the benefit of provisional application Ser. No. 61/519,980 filed on Jun. 2, 2011. Each of these related applications is hereby incorporated herein by reference in its entirety.

Our prior U.S. Pat. Nos. 6,985,294 Full Spectrum Color Projector, Issued on Jan. 10, 2006, Inventor: Johnson, et. al; U.S. Pat. No. 7,437,000, Full spectrum color detecting pixel camera, issued on Oct. 14, 2008, Inventor: Rosenthal, et. al; U.S. Pat. No. 7,527,680, Electromagnetic Spectral-Based Imaging Devices And Methods, Inventor: Rosenthal, et. al.; U.S. Pat. No. 8,507,836, Software Defined Lensing, Inventor: Rosenthal, et. al.; and Allowed patent application Ser. No. 13/506,970 are hereby incorporated herein by reference.

TECHNICAL FIELD

The present invention relates to high-density, long-term, archival data storage, and more particularly to storage using electromagnetic waves embedded in photosensitive emulsions.

BACKGROUND ART

It is known in the prior art that the frequency of light waves can be captured in silver halide photographic emulsion in the form of vertically embedded standing waves, with the wave's nodal points physically representing its frequency. In 1908 Gabriel Lippmann won the Nobel Prize in Physics "for his method of reproducing colours photographically based on the phenomenon of interference" (quote from the Presentation Speech by Professor K. B. Hasselberg, President of the Royal Swedish Academy of Sciences, on Dec. 10, 1908). This specific technique was first described in 1891 to store and extract color information from specially constructed monochromatic photographic plates (Lippmann, G, "La Photographic des Couleurs," *Compte Rendes a l'Academie des Sciences*, Tome 112, pp 247-275, February 1891). While never commercialized successfully because of the difficulties of viewing the color image, reproducing the image beyond its first iteration on a glass plate, and the rudimentary, extremely slow photographic chemistry at the time, the Lippmann process is applied in the present invention in a novel methodology and apparatus for the storage of digital data as well as human-readable images and text, as described herein.

The Lippmann process works as follows: the lightwave color palette contains the information in the form of a ray representing the specific colors. This forward ray (entering through the transparent side of the storage medium) traverses the emulsion and is reflected back from a reflecting layer (in Lippmann's specific case the reflective layer was a pool of liquid mercury. As the reflected light wave returns through the emulsion it combines with the forward wave, causing interference. This interference results in cancellation of the light at opposing wave nodes and reinforcement at the in-phase nodes. Thus, vertically through the emulsion, there are regularly spaced areas of exposure (where the waves reinforce), followed by areas of zero exposure where the waves cancel.

The Lippmann silver grains as exposed (and developed) are embedded in successive laminae coinciding with the anti-nodal planes of the standing waves recorded, equal to the half-wavelength of the light that forms the waves. This is known in the art as a "Lippmann emulsion"—a relatively thin, transparent, and extremely fine-grained panchromatic photosensitive coating, as described further in excerpts from contemporary texts below. The spacing of the exposed vertical grains literally represents the wavelengths of the specific impinging light. For each color this spacing is, of course, different. A contemporary explanation and some history of the prior art is in Wood, R W, *Physical Optics*, Macmillan, 1934, pp 214-217, excerpted herein, especially the illustrations for the laminae, reproduced herein as prior art in FIGS. 6 and 7:

"Lippmann's Color Photographs. Photographs in natural color were accidentally obtained by E. Becquerel in 1850, by means of standing light-waves, although he was not aware of the part they played. In 1868 Zenker explained the colors, sometimes seen in Becquerel's photographs of the spectrum, as due to standing waves, formed by the reflection of the light from the surface of the silver plate on which the sensitive film was formed. The silver was reduced in the anti-nodal planes forming a system of reflecting laminae, which showed interference-colors in reflected light . . . .

"A process of direct color photography, based upon this principle, was originated by Lippmann in 1891. The photographic plate is placed in the camera with the glass side facing the objective, and the sensitive film backed by a reflecting layer of mercury. This of course requires a special form of plateholder.

Figure 6:
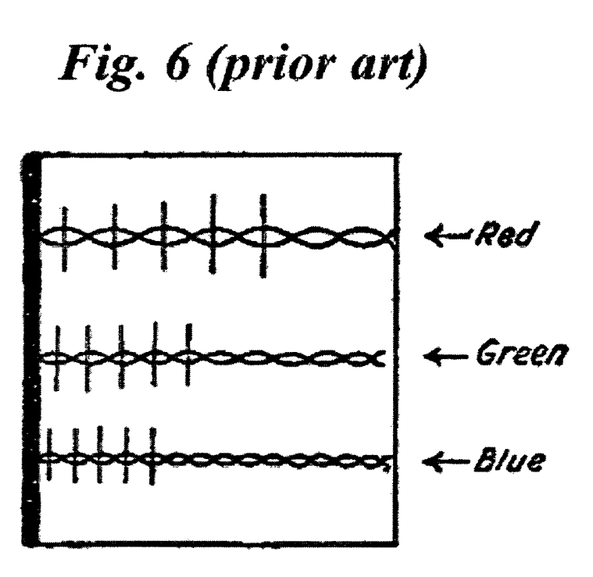
FIGS. 6 and 7 are reproduced from prior art in Wood, op. cit., as discussed above.
Figure 7:
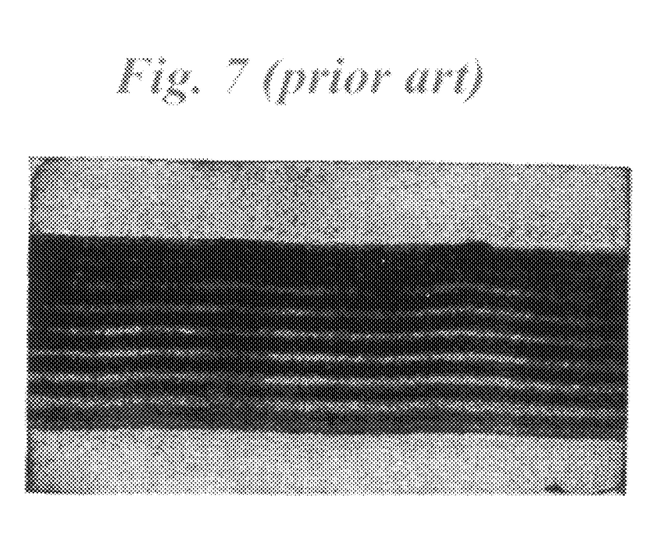

"A system of stationary waves is formed in the film as shown in FIG. 136 [illustrated herein as FIG. 6, prior art], and the silver compound is acted upon only at the antinodes, which form planes parallel to the reflecting surface. On developing and fixing the plate in the usual manner, it is found that the film shows, in reflected light, brilliant colors, similar to the colors which illuminated it. The silver, instead of being reduced in a mass, uniformly distributed throughout the thickness of the film, is laid down in thin laminae, coinciding with the antinodal planes of the stationary light-waves. The distance between the laminae is equal to the half wave-length of the light which formed them, consequently they show the same color by interference in reflected light . . . .

"By cutting a section of the film and examining it with a microscope, the laminae thrown down by the standing light-waves can be seen and counted. It was found in this way that as many as 250 laminae could be formed, if the sensitizing dye was introduced into the emulsion and the plate developed with hydroquinone. In the case of bathed plates the sensitizing action only penetrated a short distance, and with pyrogallic acid development the developing action occurred chiefly near the surface, limiting the possible number of laminae. A microphotograph of a similar section by Mr. Senior is reproduced in FIG. 138 [illustrated herein as FIG. 7, prior art]. Neuhauss in 1898 was the first to make thin sections of the film and observe the laminae with the microscope. Since the distance between them is $\lambda/2$ they are at the limit of the resolving-power of the microscope, but the effective distance can be increased by cutting sections in an oblique direction, or by causing them to swell by the application of moisture as was done by Cajal.

"Neuhauss improved the color process by bleaching the pictures with bichloride of mercury; this treatment increases the transparency of the laminae without sensibly reducing their reflecting power, consequently a larger number are able to cooperate, as the incident light is able to penetrate to a greater depth."

Note that Wood indicates that the laminae, representing physically the actual wave lengths of light, are closer together than contemporary optical microscopes could resolve at the time. So to produce a microphotograph [e.g., FIG. 7, prior art for this invention] it was necessary to expand the emulsion, as per Neuhauss as cited. (Today such cross-sections can be observed using an electron microscope.) In one embodiment of this invention described below we apply a similar methodology and apparatus to alter the wavelengths of the diffraction gratings or standing waves in order to more readily detect their frequency.

In Lippmann's original process, the colors represented a mapping of the actual colors of a scene focused on the special emulsion by a conventional camera apparatus. A full-color image with the Lippmann process is reconstructed by shining a white light source at a critical angle reflected toward the viewer from the developed and fixed emulsion, with the vertical interference columns being observed as the true colors of the original by the human visual system. In contrast to the prior art, the present invention only needs to record a small region for each data constellation, plus on the same emulsion monochromatic photographs, or interference color images, and human readable text, and microtext, if needed for reference, indexing, or for future retrieval where the details of the process may have been forgotten. This invention's data storage location methodology therefore simplifies the writing and reading apparatus for the embodiments described herein.

The Lippmann emulsion is developed, as known in the art, using specified photographic chemistry for its ultra-fine grain processing. As noted in the excerpt from Wood (op. cit, pp 215-217) above, the development and bleaching process is aimed primarily at the surface of the emulsion so as to minimize the number of laminae (hence this invention's requirement for a thin emulsion), and to eliminate most of the silver, so as to increase "the transparency of the laminae without sensibly reducing their reflecting power . . . " (as per Neuhauss, in Wood, op. cit., p. 217). (For additional prior art on modern development see Rich, C, "Lippmann Photographic Process Put to Practice", SPIE v. 2688, Society of Photo-Optical Instrumentation Engineers, 1996, pp. 88-95; U.S. Pat. No. 4,202,695; and Bjelkhagen, H I, *Silver-Halide Recording Materials for Holography and Their Processing*, Springer, 1995, esp. ch. 2.2.2, pp. 37ff on the preparation and developing formulae for Lippmann emulsions.)

Further details of the Lippmann process are described in a more recent book by L. A Mannheim thusly:

"58. Diffraction Colour Systems. A prism is the usual way of splitting white light into its spectral components. An alternative method is to employ a diffraction grating, i.e. a grid of regularly spaced lines ruled into for instance the surface of a glass plate, or a series of regularly spaced layers within the depth of a film emulsion. If the spacing is of the order of the wavelength of light, interference effects result in the reflection of light of specific wavelengths when white light is directed at this diffracting arrangement. This action is analogous to the selective colour transmission of interference filters . . . . The colour seen depends on the exact spacing of the grating lines or planes. If such planes can be formed of silver deposits in an emulsion, we could have a system of colour reproduction involving only diffracted light and no dyes. The earliest colour photographic process to use this idea was the Lippmann process. It was carried out by exposing a panchromatic plate, the emulsion of which was almost transparent, with its emulsion surface in contact with a metallic mirror. This was achieved by building special dark slides which allowed mercury to be run in behind the plates in order to ensure optical contact between the emulsion and metallic reflecting surface. Light passed through the emulsion and was reflected back by the mercury surface, but the light on the return passage through the emulsion layer was out of phase with that on the first passage. Thus an interference was set up and this resulted in the emulsion layer being rendered developable where the peaks of the waves coincided. The distribution of the image through the thickness of the emulsion layer when the plate was developed, was therefore dependent on the wavelength of the exposing light at every point on the picture. The developed negative was backed up with a mirror and viewed by reflected light. When the plate was illuminated and viewed at the correct angle the picture was seen in full colour. At every point in the picture light of all wavelengths, other than those which gave rise to the image, was absorbed. Those wavelengths which could go through the image and, after reflection, come back through the image, gave the correct colour sensation. From a scientific point of view this is an extremely elegant process but in practice it is not very useful. Not only are the taking and viewing conditions critical but emulsions of sufficient transparency are very slow." [*Photography Theory and Practice*, Amphoto, 1970, Vol I, Sect 58, emphasis added]

The ability to store data using light is generally limited by the wavelength of light. This has recently been exemplified by the introduction of so-called "Blu-Ray" DVD recorders. The shorter wavelength of the blue light source nearly doubles the recording density and, thus, the playing time. However, the lifetimes of such media are relatively short, ranging from a few years to possibly a century or a bit more if extreme care is taken to preserve the media against environmental damage (Solomon, R J, et. al., "Write Once, Read Forever (WORF): Low-energy storage in perpetuity of high-density, multi-state data," *Archiving* 2014 *Final Program and Proceedings*, Berlin, Society for Imaging Science and Technology, vol. 5, pp. 118-122).

In accelerated testing as known in the art, silver- or metallic-based photographic media have been estimated to last upwards of tens of thousands of years, without requiring special energy-intensive storage conditions—a true archival system for future generations (Wilhelm, H, "Long-Term Preservation of Photographic Originals and Digital Image Files . . . ", *IS&T's Archiving* 2008 *Conference in Bern, Switzerland*, Jun. 26, 2008, Society for Imaging Science and Technology, p. 4). Specifically referring to the archival qualities of the modern application of the process, C. Rich (op. cit., p. 88) states that:

The Lippmann process . . . was the first stable direct color photographic process that derived it's color response from the recording of standing waves of light in the emulsion . . . . Using Bragg selectivity rather than absorbing dyes . . . , more than 100 years has proven a Lippmann type photograph's color stability [emphasis added, with "Bragg selectivity" implying detection of standing waves embedded as interference gratings].

SUMMARY OF THE EMBODIMENTS

Our prior U.S. Pat. No. 6,985,294 Full Spectrum Color Projector, Issued on Jan. 10, 2006, Inventor: Johnson, et. al; U.S. Pat. No. 7,437,000, Full spectrum color detecting pixel camera, issued on Oct. 14, 2008, Inventor: Rosenthal, et. al;

U.S. Pat. No. 7,527,680, Electromagnetic Spectral-Based Imaging Devices And Methods, Inventor: Rosenthal, et. al.; U.S. Pat. No. 8,507,836, Software Defined Lensing, Inventor: Rosenthal, et. al.; and Allowed patent application Ser. No. 13/506,970 are hereby incorporated herein by reference.

In one embodiment, this invention provides an archival optical data storage system and method storing interference gratings in a monochromatic emulsion, which gratings represent the data as wavelengths and irradiance levels of light. The read portion of this archival storage system is comprised of a white light source irradiating the previously exposed and developed emulsion so as to reveal the frequencies and levels representing the stored data.

In the various embodiments of the invention there is provided a data storage medium, consisting of a transparent superstratum, on one surface of which is deposited a photosensitive emulsion, and an apparatus for reflecting the interference waves to create the standing waves. In the original Lippmann process the reflecting apparatus was provided by a mercury layer. In this invention In various embodiments the surface of the emulsion is in contact with a material, or a gas, or a vacuum, creating a high refractive mis-match which is utilized as the reflective mechanism.

In one embodiment the reflective layer is deposited on the emulsion therefore the development process includes sufficient chemistry to dissolve the reflective layer completely.

In various embodiments, the technology described for this invention is applied to flexible media, such as motion picture or still image film.

In various embodiments, the reflective methodology and apparatus for the data storage medium is fabricated with a high mismatch of index of refraction material, or coupled to a reflection layer.

In various embodiments the spacing between the exposed laminae which determine the standing waves' frequency may be shifted to a different band or frequency for calibration to a reference, to increase contrast or enable detection by sensors working in bands or frequency different from the original radiated frequency.

For data storage the colors or frequencies can be represented as data constellations.

In various embodiments for reading this data, the same light source as is used for writing is used to select the modulated wavelengths of interest.

Multiple wavelengths define multiple bits or multiple states, with each wavelength representing a different number. Each data storage location can represent a data word or multiple data words in the form of a constellation of data.

In another embodiment, since the data is presented monochromatically at the wavelength of interest, it is not necessary to use a spectrum analyzer to determine the wavelength of interest.

In another embodiment the wavelength of interest can be modulated by an additional signal for writing, and detected and demodulated for reading, which may indicate a distinguishing function embedded in the wavelength.

In an embodiment for reading the data, a camera capturing images of a sequence of monochromatic frames, for each of the frequencies of interest, permits large amounts of data to be read in parallel.

In a related embodiment for writing the data, a projector displays images of a sequence of monochromatic frames, for each of the frequencies of interest, to be exposed on the data storage media, that permits large amounts of data to be written in parallel.

In another embodiment the same data are copied onto separate archival data storage media each consisting of one or more sets of "complementary colors" offering a rapid means of error and noise detection simultaneously for a large data set.

In another embodiment, metameric colors are used for comparison using the human visual system.

In a related embodiment errors, noise, or irrelevant data are detected or suppressed by combining optically or via data processing means otherwise identical images.

In a related embodiment a mask is utilized covering the media to reveal or to suppress the data storage locations containing select interference gratings.

The archival data stored on this invention is "write once," therefore raw data can never change and thus the file allocation table (FAT) to locate the data can never change.

In various embodiments, this invention is for permanent data storage, with the data plus human visible text, microtext and images making possible a storage device for data and images that is more likely to be recognized and read in the far future.

The use of silver halide photographic apparatus and methodologies in this invention, which are known to have extremely long life, makes it well-suited for permanent archival storage.

In various embodiments to extend the long-term archival properties of the media, to optimize the performance of the diffraction gratings, and to control the gamma for the visible Lippmann interference images and other human visible images, text, and microtext, chemical methodologies and apparatus, such as selenium toning, may be used after development.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions

As used in this description of the invention and the accompanying claims, the following terms shall have the meanings indicated, unless the context otherwise requires:

Pixel is synonymous with a data storage location which contains a data word.

A data constellation is a virtual representation of data sets or words, or groups of data sets. Each constellation point represents the combination of variables that validate the data. Relevant to this invention, data sets may contain wavelengths of interest, defined irradiance levels, polarization axes, sub-carriers and modulated signals, and standing wave angles (from the grating normal), all representing digital data stored in the data storage medium. See illustrations and discussions for FIG. 1A, item 14, and FIG. 3.

A Lippmann emulsion is an archival photosensitive layer (e.g., a chemical composition of silver halide, as known in the art, or another archival photosensitive composition) having a thickness of several wavelengths of the color palette of interest (e.g., approximately two microns), while its grain size is small enough to encode a vertical diffraction gating within the color palette of interest (similar to the dimensions of a Lippmann emulsion as described in the extract above from Wood, op. cit., pp. 214-217 and FIGS. 137-138). For use in embodiments of this invention, the "Lippmann emulsion" differs from that described by Lippmann, in that it is modified to provide a data storage medium which contains data constellations at data storage locations.

The grating normal is used to define the angle between the incidence light beam and the diffracted beam of its first order component (viz., Palmer C and Loewen E, *Diffraction Grating Handbook*, 6$^{th}$ Ed., 2005, Newport Corporation, Rochester, N.Y., chap. 2, "The Physics of Diffraction Gratings", esp. FIGS. 2.1, 2.2, 2.4 and 2.5; and Ditchburn R W, Light, Dover, 1991, pp. 181 ff.)

Metameric colors are combinations of light frequencies that appear colorimetrically identical to the human visual system even though the frequencies that combine may not be identical.

A modulatible light source is an electromagnetic wave transmitter working in the light bands infrared through visible light to ultraviolet and soft X-rays) that is capable of amplitude or frequency or radiance modulation, or altering its wavelength or frequency output, or any combination of these factors, according to control signals from a processor.

A color palette is the range of colors, frequencies, and bandwidths of interest chosen by the processor for data storage and readout in the emulsion.

DETAILED DESCRIPTION OF SPECIFIC EMBODIMENTS

The embodiments of the invention described herein are intended to be merely exemplary; numerous variations and modifications will be apparent to those skilled in the art. All such variations and modifications are intended to be within the scope of the present invention as defined in any appended claims.

Figures 1A, 1B:
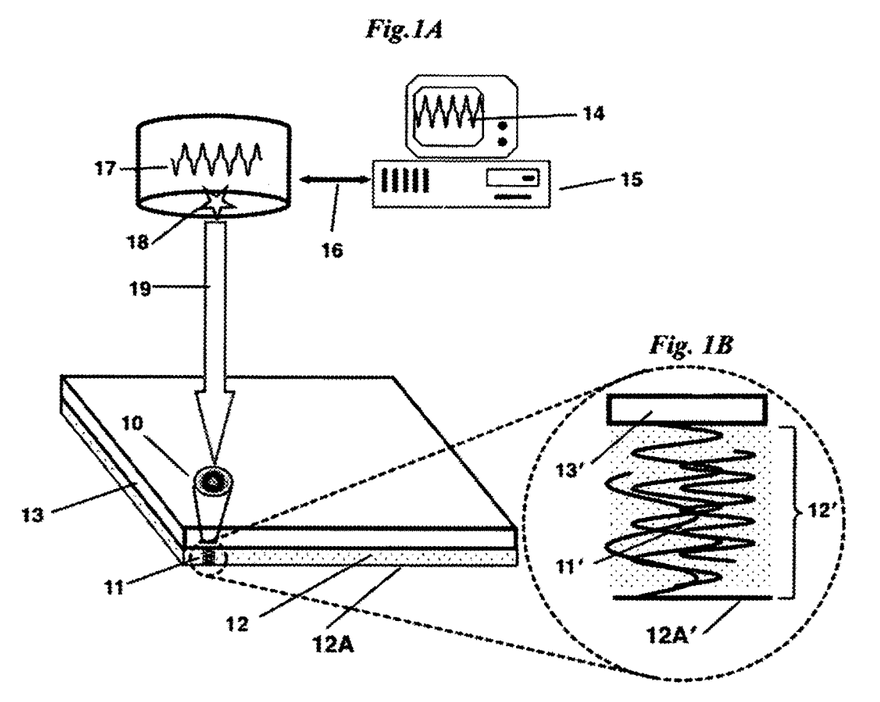
FIGS. 1A and 1B illustrate the invention's methods and apparatus for one embodiment for writing a complex wavetrain representing an interference grating combining multiple frequencies for one pixel at one data storage location on a photosensitive medium.

FIG. 1A (and inset exploding one data storage location in FIG. 1B) illustrates one embodiment wherein processor 15 assigns light wave frequencies of interest representing digital data or data constellation 14 to light control signal 16 using apparatus 17 to be permanently recorded at data storage location 10 within data storage medium 12. Data storage medium 12 is coated underneath transparent superstratum 13 (and FIG. 1B, 13') which includes substratum reflective layer 12A (and 12A') coated on interstitial emulsion 12's bottom edge. Apparatus 17, consisting of a precision hard disk driver magnetic head assembly (e.g., Western Digital Model WD800AAJB, Western Digital Corporation 20511 Lake Forest Drive Lake Forest, Calif. 92630) is modified by replacing the magnetic head with light source 18 (e.g., as taught in patent '294) capable of generating and modulating a modulatible beam 19 comprising the narrow light band frequencies to be exposed in emulsion 12. Link 16 also sends controls signals to apparatus 17 comprising the precision data storage location of beam 19 on superstratum 13. Light from beam 19 (1) penetrates emulsion 12 (and 12'); thence, (2) due the optical refractive index mis-match of the emulsion's surface with air a standing wave is reflected in a backwards direction through the emulsion; (3) the sum of the forward and reflected light waves creates a vertical interference grating which represents data 14 at one data storage location 10 (exploded in FIG. 1B). The emulsion is then developed to archival standards as known in the art (see references in background art section).

Also in various embodiments, the light source may be one or a plurality of lasers according to the wavelengths of interest or color palette required (e.g., Circular 1 mm Beam, ULN, Ultra-Low Noise LabLaser 635 nm 5 mW C ULN, Part No. 31-0144-000, Coherent Inc. 5100 Patrick Henry Drive Santa Clara, Calif. 95054 USA). Alternatively, the light source may be any suitable non-coherent light source, such as an incandescent light, an LED light, a fluorescent light, or a gas discharge light. Such a light may operate in the visible spectrum and emit white light, but other spectral ranges can also be employed.

In various embodiments, the light beam is optionally transmitted via a fiber optic, or similar device, with the location of the fiber tip adjacent to the storage medium being controlled by the modified precision disk driver apparatus.

In another embodiment, separate, multiple vertical gratings per data storage location unique to each wavelength and adjacent to each other are recorded as per the methodology and apparatus above.

In another embodiment, separate, multiple vertical gratings per data storage location unique to each wavelength and at different depths in the same data storage location are recorded as per the methodology and apparatus above.

In various embodiments, the wavelengths may range from the infrared to the ultraviolet or soft x-rays.

Figures 2A, 2B:
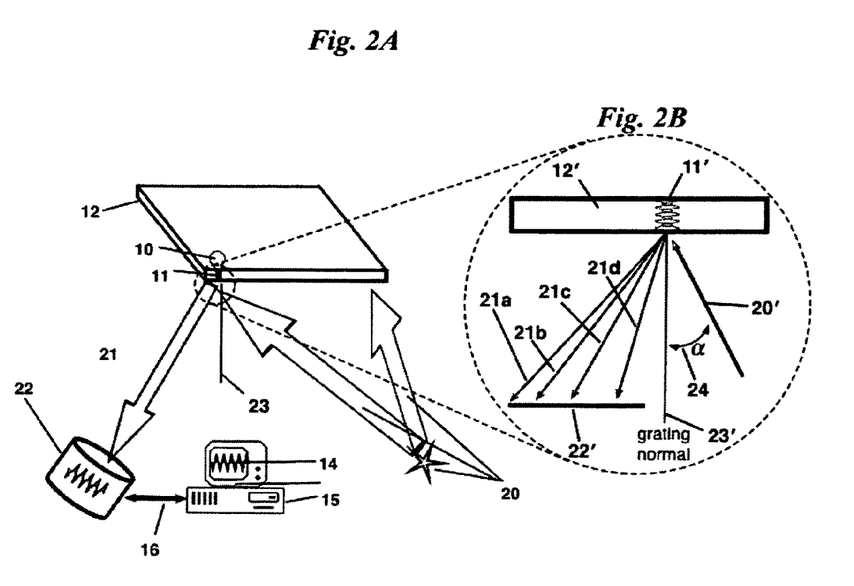
FIGS. 2A and 2B illustrate an embodiment wherein this invention locates with precision a data storage location and reads the data word encoded in the data constellation.

FIG. 2A (and inset, FIG. 2B, exploding the diffraction mechanism at the data storage location) illustrates retrieval of the spectral data stored in diffraction grating 11 embedded vertically in emulsion 12 by illuminating emulsion 12 with incident white light beam 20. Diffracted light 21 captured along the path of the grating normal angle (illustrated in FIG. 2B inset) will contain only those frequencies that had been encoded earlier (as described in FIGS. 1A and 1B). Each specific frequency stored in emulsion 12 at data storage location 10 radiates embedded diffraction grating 11's spectral components according to grating normal 23 angle with incident beam 20. Diffracted beam 21 is detected with spectrometer 22 (for example, patents '000, '294, '680 or '836 cited herein) which sends the captured spectral information on link 16 corresponding to the constellation parameters of the data recorded at data storage location 10 which is then output to data processor 15. FIG. 2B (based on Palmer, op, cit. FIG. 2-5) illustrates in more detail one example of how the grating normal angle, as known in the art, works to disperse the incident light into the component spectral frequencies stored at data storage location 10 in FIG. 2A. Incident light beam 20' irradiates at positive angle α (24) from grating normal 23' (and FIG. 2A, 23) diffraction grating 11' embedded in emulsion 12'; the light is diffracted toward spectrometer detector 22' according to the frequencies of interest as selected by the processor in negative spectral diffraction angles 21a, 21b, 21c, and 21d. Detector 22' is configured so as to receive the diffracted output corresponding to the angle defined by the grating normal corresponding to each wavelength stored in the emulsion.

In various embodiments, the emulsion is irradiated from a white light source adjacent to the emulsion and the data storage location being read.

In another embodiment, the output beam is detected via a fiber optic, or similar device, connected to the spectrometer, with the location of the fiber tip adjacent to the storage medium at the data storage location. The entry port of the fiber optic is large enough to receive the spectral output of the vertical gratings stored in the emulsion at the grating angle corresponding to the stored wavelengths.

Figure 3:
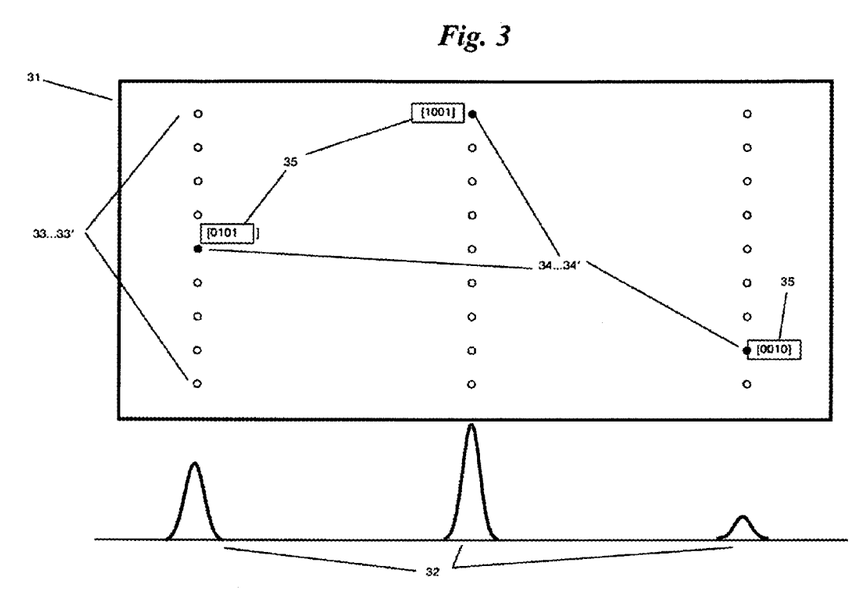
FIG. 3 illustrates a data constellation at a data storage location.

In one embodiment, the constellation diagram in FIG. 3 depicts how data is represented, within the constellation points arranged in grid 31. For one standing wave diffraction grating its wavelength 32 and its irradiance levels 33 . . . 33' represent multiple valid states. 34 . . . 34'. These states are translated into binary data byte values 35 (e.g., binary numbers 0101, 1001, and 0010 respectively). In other embodiments, a data constellation may contain a different set of lightwave variables.

Figure 4:
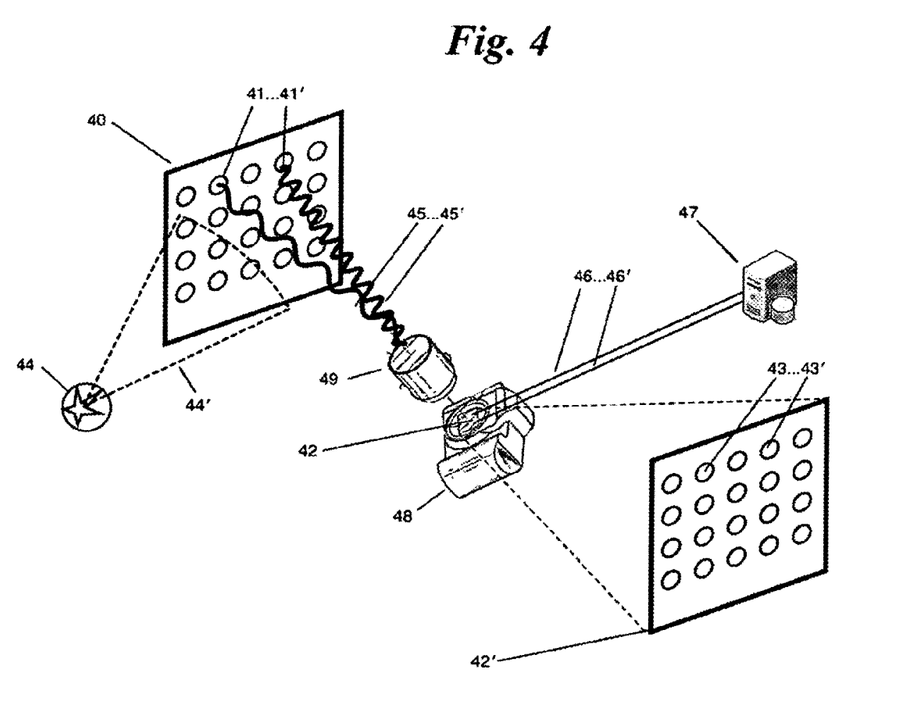
FIG. 4 illustrates parallel retrieval of data constellations from multiple data storage locations simultaneously.

In an embodiment illustrated in FIG. 4, the data storage medium retrieves n data storage locations or constellations simultaneously instead of sequentially, permitting transferring the data in parallel, allowing much faster random access. For example, data storage medium 40 contains n data storage locations 41 . . . 41' consisting of previously written data. Sensor 42 in camera 48 contains n monochromatic light wave detectors 43 . . . 43'. Wavelengths of interest are irradiated by light source 44 (e.g., as described in patent '294), set at its critical angle 44', causing each of the n data location gratings 41 . . . 41', that have stored those wavelengths, to radiate diffracted lightwaves 45 . . . 45' which enter lens 49. In this embodiment lens 49 is a telecentric lens, as known in the art, to minimize perspective and lens distortions. The wavelengths are focused on sensor 42, shown as an enlargement at 42', and each of lightwaves 45 . . . 45' are detected respectively by each detector 43 . . . 43', hence each of n data storage locations 41 . . . 41' are captured simultaneously by detectors 43 . . . 43'. Data 46 . . . 46' are output in parallel to be processed by data processor 47. This is faster than outputting data sequentially as is common with contemporary magnetic and similar storage media.

In other embodiments different light sources, lens configurations, and sensors may be used to achieve similar functionality as the embodiment illustrated in FIG. 4.

Figure 5:
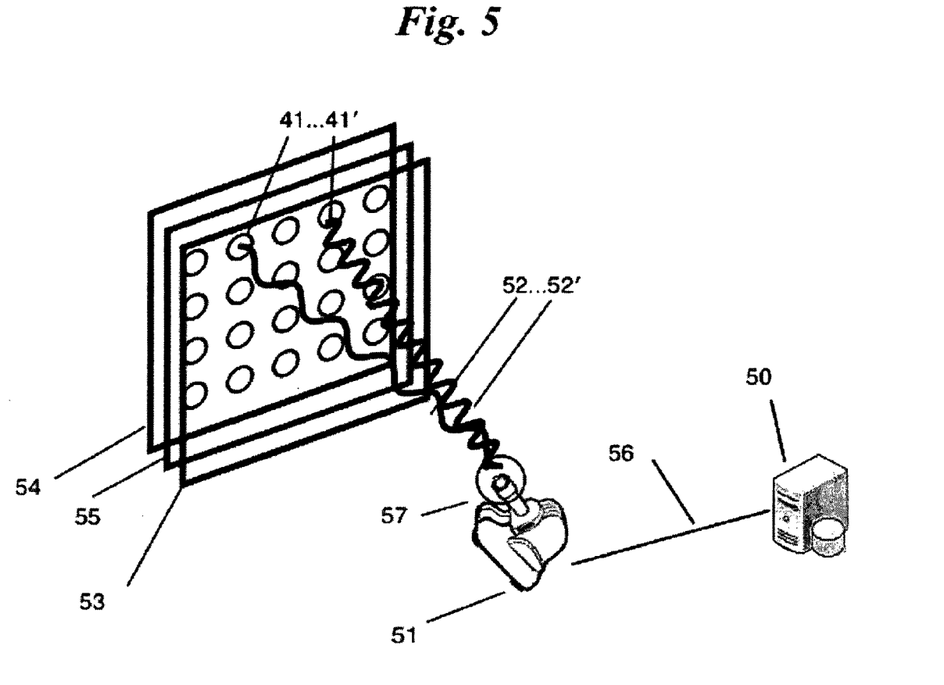
FIG. 5 illustrates writing data constellations to multiple data storage locations simultaneously.

In an embodiment illustrated in FIG. 5, the data processor 50 assigns the corresponding constellation parameters of the data recorded at data storage parameters for n data pixels and couples them via channel 56 to projector 51, based on patent '294. Projector 51 projects wavelengths 52 . . . 52' onto data storage medium 53 with reflective layer 54 and emulsion layer 55. The forward beams 52 . . . 52' focused by lens 57, in this embodiment a telecentric lens as known in the art to minimize perspective and lens distortions, enters emulsion 55 reflecting off layer 54 thereby creating standing waves simultaneously in emulsion 55 representing diffraction gratings 41 . . . 41' as in FIG. 4.

In other embodiments different image projector apparatus and lens configurations may be used to achieve similar functionality as the embodiment illustrated in FIG. 5.

In one embodiment, this invention provides an archival optical data storage system. This embodiment includes a first apparatus comprising:

A write-once data storage system comprising:
a digital data input that receives digital data to be recorded;
a processor, coupled to the digital data input, running a first process that assigns frequencies of interest into a light control signal to store the digital data;
a light sensitive storage medium having a transparent top layer on which is deposited a Lippmann emulsion on the bottom surface, wherein the emulsion has a thickness of several wavelengths of the assigned frequencies of interest and a grain size small enough to encode a vertical diffraction grating for each of the assigned frequencies of interest;
a light source that produces a beam having all of the assigned frequencies of interest existing at the same time, wherein a subset of the assigned frequencies of interest containing less than the total number of the assigned frequencies of interest is produced to have a continuous wavelength bandwidth from a lowest to a highest frequency of the subset and the beam is manipulated to cause each wavelength contained within the continuous wavelength bandwidth to have substantially the same amplitude level, wherein the light source is modulatible, having a modulated input coupled to the light control signal;
a positioning system within which the light source is mounted; and,
the processor, also being coupled to the positioning system, miming a second process that controls the positioning system, wherein the processor controls the light source and the positioning system to cause the beam to expose a usable area of the emulsion to light that is modulated in a manner corresponding to the digital data input to create vertical diffraction gratings in the emulsion, wherein each vertical diffraction grating is created to correspond to only one of the assigned frequencies of interest and to correspond to the recorded digital data, wherein the vertical diffraction gratings are stored in the emulsion and provide archival storage of the digital data.

The write-once data storage system according to the above having an apparatus to develop the emulsion.

The write-once data storage system of the above, further comprising:
a white light source irradiating the emulsion at an incident angle which causes diffraction of the white light source in the vertical diffraction gratings stored within the emulsion so as to produce a diffracted output at angles corresponding to wavelengths defined by the vertical diffraction gratings;
a detector, mounted on the positioning system, to detect the diffracted output from a data storage location in the emulsion and to detect spectral components of the diffracted output at the data storage location and provide a spectral signal; and
the processor, further being coupled to an output of the detector, running a third process that converts the spectral signal into the digital data.

A method for storing data comprising:
receiving digital data to be recorded at a digital data input;
coupling a processor to the digital data input;
running a first process on the processor that assigns frequencies of interest into a light control signal to store the digital data;
providing alight sensitive storage medium having a transparent top layer on which is deposited a Lippmann emulsion on the bottom surface, wherein the emulsion has a thickness of several wavelengths of the frequencies of interest and a grain size small enough to encode a vertical diffraction grating for each of the frequencies of interest;
providing a light source;
producing a beam having all of the assigned frequencies of interest existing at the same time with the light source;

manipulating the beam to produce a subset of the assigned frequencies of interest containing less than the total number of the assigned frequencies of interest, wherein the subset is produced to have a continuous wavelength bandwidth from a lowest to a highest frequency of the subset;

manipulating the beam to cause each wavelength contained within the continuous wavelength bandwidth to have substantially the same amplitude level;

coupling the light source to the light control signal;

modulating the light source according to the light control signal;

providing a positioning system within which the light source is mounted;

coupling the positioning system to the processor;

running a second process that controls the light source and the positioning system to cause the beam to expose a usable area of the emulsion to light that is modulated in a manner corresponding to the digital data input;

creating vertical diffraction gratings in the emulsion, wherein each vertical diffraction grating is created to correspond to only one assigned frequency of interest and to correspond to the recorded digital data;

storing the vertical diffraction gratings in the emulsion; and providing archival storage of the digital data.

In another embodiment the positioning systems as summarized above may be one and the same.

Since this invention is not being applied for reproducing a full-spectrum, interference-based color photograph, as per Lippmann's process, and instead the frequencies embedded as diffraction gratings in this invention's emulsion represent multi-state data, defined and described below, we will refer herein to this invention's emulsion, where applicable, as the "data storage medium."

In the present invention the Lippmann process, as described above in the background art, is further modified for data storage in the embodiments as follows:

In the various embodiments of the invention there is provided a data storage medium, consisting of a transparent superstratum, on one surface of which is deposited a photosensitive emulsion, and an apparatus for reflecting the interference waves to create the standing waves, as described below. In the original Lippmann process the reflecting apparatus was provided by a mercury layer. In various embodiments discussed below, this invention teaches processes for replacing the mercury with less-toxic, highly reflective apparatus and methods including, but not limited to, liquid, solid, nano-particles, super-hydrophobic or dry particulate substances that will not interact with the undeveloped data storage medium, and that can be removed before, or is compatible with, development of the emulsion.

Retro-reflectors return the incoming light waves back to their source, and therefore are effective even when the incoming light ray deviates substantially from the normal to the reflecting surface. One embodiment applies a glass-bead structure, as is used in "Scotchlite™," manufactured by the 3M Company (3M Center, St. Paul, Minn. 55144-1000), adjacent to the emulsion layer. The retro-reflective layer's index of refraction is created by using a carefully controlled combination of glass bead diameter, glass bead index of refraction.

In another embodiment for a reflective layer a liquid mirror is made of silver nano-particles. It is known in the art that silver nano-particle spheres can be made at approximately 50 nanometers in diameter which would be sufficiently small to act as a liquid mirror for this invention. (Gingras, J, et al, "Surface films of silver nanoparticles for new liquid mirrors," ColloidsSurf., A (2006) v. 279, pp. 79-86, esp, Sect. 3.1 for size). Another example of high index of refraction materials includes sapphire.

In various embodiments an emulsion material with high refractive mis-match with air is utilized for the reflective mechanism.

In all the embodiments for a reflective layer opposite the data storage medium's emulsion an optically refractive index mis-match is required over the specified frequency range to function as a reflective mechanism to create the standing waves. As known in the art, for example, an air-glass interface impinged by lightwaves at the correct angle creates a sufficient refractive mis-match to reflect lightwaves back towards the reflective apparatus adjacent to the emulsion, thereby creating the nodes and antinodes of the standing waves in the emulsion.

In one embodiment the reflective layer is deposited on the emulsion, therefore the development process includes sufficient chemistry to dissolve the reflective layer completely, yielding a data storage medium with sufficient transparency so the interference patterns can be read. (The invention's photosensitive data storage medium does not include an antihalation layer as with conventional photographic media since that would obviate the function of the reflective layer.)

In various embodiments, the technology described for this invention is applied to flexible media. An example of flexible media is motion picture or still image film as known in the art. The methodologies, apparatus and embodiments described herein are suitable for flexible or non-optically flat media since the mechanism for reflecting the incident light waves creates one or more standing waves at the specific location of the data pixel being recorded.

In various embodiments, the reflective methodology and apparatus for the data storage medium fabricated with a high mismatch of index of refraction material, or coupled to a reflection layer, allows the standing waves representing data pixels to be stored in the medium uncoupled physically and optically from other pixels in the medium. Therefore it is not necessary to reduce vibration or keep the material flat for writing or reading the data. (Since Lippmann's process focused a scene as a color photograph onto the emulsion requiring an optically flat reflective backing adjacent to the surface of the emulsion, which is not necessary for our process.)

In various embodiments a nano-particle material, as described above (Gingras, op. cit.), adhering to a flexible data storage medium during data storage can be readily washed off after exposure and before development.

In various embodiments the spacing between the exposed laminae which determine the standing waves' frequency may be shifted to a different band or frequency for calibration to a reference, to increase contrast or enable detection by sensors working in bands or frequency different from the original radiated frequency. It is possible to store gratings in one band of the electromagnetic spectrum and physically expand or contract the emulsion so that the wavelengths shift in frequency. Expansion can be done using a chemical additive process or other means, for example as per Neuhauss as discussed in the prior art above (Wood, op. cit., p. 217).

For data storage the colors, frequencies, or other lightwave parameters can be represented as data constellations. The surface of the emulsion is positioned for writing and reading in virtual regions. Each of these virtual regions constitutes a data storage location. In one embodiment to write a data constellation in a data storage location, the data storage location is irradiated with the specific modulated wavelengths representing the specific data constellation to be recorded.

The modulated wavelengths for each data storage location may be generated as discussed in U.S. Pat. No. 6,985,294, or through other methods.

In various embodiments for reading the data, the same light source as is used for writing is used to select the modulated wavelengths of interest. The demodulated signal of the wavelengths of interest represents the data stored at a specific location in the data storage medium. The wavelengths of interest for reading may not necessarily be the same for writing.

Multiple wavelengths define multiple bits or multiple value states (as opposed to conventional data storage applying only binary states), with each wavelength representing a different number, e.g., base two or higher. Due to the multiple wavelengths possible in each data storage location, each data storage location can represent a data word or multiple data words, as known in the art, in the form of a constellation of data. One such embodiment is illustrated below in FIG. 3. In this invention a data constellation freezes the data in time, using a methodology analogous to quadrature amplitude modulation (QAM) as known in the art for digital communications signaling.

In another embodiment, since the data is irradiated monochromatically at the wavelength of interest, and only requires detection to extract its irradiance level at each data storage location, it is not necessary to use a spectrum analyzer (as shown in FIG. 2A) to determine the wavelength of interest.

In another embodiment the wavelength of interest can be modulated by an additional signal for writing, and detected and demodulated for reading. This can be a sub-carrier on the specific wavelength's sine function, analogous to sub-carriers on a frequency modulated (FM) broadcast signal.

In another embodiment, the presence of the sub-carrier may indicate a distinguishing function embedded in the wavelength. An exemplary embodiment applying patent '294 has the ability to distinguish between two identical wavelengths being generated where the demodulation of a sub-carrier represents the actual frequency of vibration of patent '294's digital micro-mirrors. This permits applying a modulation transfer function spatially or temporally to the carrier represented by the wavelength for additional information in the data constellation.

In another embodiment the same data are copied onto separate archival data storage media each consisting of one or more sets of "complementary colors" as known in the art. The complements may be established according to a pre-determined wavelength table or algorithm. When the data storage media with complimentary colors are compared optically, via a means of registering the data locations of interest, data errors or noise will be revealed visually to a human observer. Compared to the prior art of data technology, where errors have to be detected sequentially, this methodology and apparatus offer a rapid means of error and noise detection simultaneously for a large data set.

In another embodiment an image detector and data processing means is used to compare one or more sets of complimentary data storage media, as per the above, to detect data errors and noise.

In another embodiment, metameric colors, instead of complementary primaries, are used for comparison using the human visual system, wherein the metameric colors can be defined according to a pre-determined wavelength table or algorithm.

In another embodiment errors, noise, or irrelevant data are detected or suppressed by comparing two or more, presumed identical, data storage media optically or via data processing means.

In another embodiment a mask is utilized occluding selected portions of the media to reveal or to suppress the data storage locations containing select interference gratings.

The archival data stored on this invention is "write once," therefore raw data can never change and thus the file allocation table (FAT) to locate the data can never change. In one embodiment the raw data is stored without a FAT for the data represented on the medium. The FAT is stored separately on a different data storage media of this invention, or other media. Both the raw data and the FAT copies are necessary for retrieval.

In various embodiments, this invention is for permanent data storage, containing in the media standing waves representing data as described herein plus additional human readable text, microtext, and images in order to preserve, index and display the necessary instructions for decoding the data recorded. Since the data, text, microtext, and images stored on the media are not re-writable, this manifold implementation of methodology and apparatus provides a storage device for data and images that is more likely to be recognized and read in the far future.

The use of silver halide photographic apparatus and methodologies, which are known to have extremely long life (Rich, op. cit.; Wilhelm, op. cit.), makes this invention well-suited for permanent archival storage. Furthermore, as known in the art, silver ions ($Ag^+$) are hostile to most bacteria and other microorganisms that attack conventional data storage media (C. Chambers et. al, "Bactericidal Effect of Low Concentrations of Silver," J. Am. Water Works Assoc., 54, 2 (1962) pp. 208-216; R. Belly and G. Kidd, "Silver Resistance In Microorganisms," Dev. Ind. Microbiol. 23 (1982) pg. 567 fn).

As known in the art, selenium toner involves a partial ion exchange with silver in the processed image, extending the lifetime of the image by decreasing the amount of unfixed silver halide, and also increasing the density of the exposed grains without altering the size of the grains or its basic grain structure in the emulsion. Because the ratio of selenium to silver increases with the density of the silver, the selenium acts more on areas with more silver.

In various embodiments chemical methodologies and apparatus, such as selenium toning as discussed above, can be used after development to extend the long-term archival properties of the media, to optimize the performance of the diffraction gratings, and to control the gamma for the visible Lippmann interference images and other human visible images, text, and microtext.

In a related embodiment a similar toning process can be used to optimize the signal-to-noise ratio of the diffracted wavelengths stored in the medium.

In related embodiments as above other chemical methodologies and apparatus may be used such as gold, platinum, palladium, and rhodium.

In related embodiments applying the chemical methodologies and apparatus described above, a mask may be applied to selected portions of the media. For example, toning might be applied to the visible images and text and withheld from the portions of the media that are exposed for the interference data storage locations. Other variations of the masking process are possible.

What is claimed is:

1. A method for storing data comprising:
    receiving digital data input words to be recorded at a digital data input;
    coupling a processor to the digital data input;
    running a first process on the processor that assigns frequencies of interest into a light control signal to store the digital data input words;
    providing a light sensitive storage medium having a transparent top layer on which is deposited a Lippmann emulsion on the bottom surface, wherein the emulsion has a thickness of several wavelengths of the frequencies of interest and a grain size small enough to encode standing waves for each of the frequencies of interest structured as a data constellation set;

providing a light source;

producing a beam having all of the assigned frequencies of interest existing at the same time with the light source;

manipulating the beam to produce a subset of the assigned frequencies of interest containing less than the total number of the assigned frequencies of interest, wherein the subset is produced to have a continuous wavelength bandwidth from a lowest to a highest frequency of the subset;

manipulating the beam to cause each wavelength contained within the continuous wavelength bandwidth to have substantially the same amplitude level;

coupling the light source to the light control signal;

modulating the light source according to the light control signal;

providing a positioning system within which the light source is mounted;

coupling the positioning system to the processor;

running a second process on the processor that controls the light source and the positioning system to cause the beam to expose a usable area of the emulsion to light that is modulated in a manner corresponding to the data constellation set representing the digital data input words;

creating a set of standing waves in the emulsion wherein frequencies and levels of the standing waves are structured as the data constellation set representing the digital data input words; and providing archival storage of the digital data input words.

2. The method according to claim 1, further comprising reading the data stored in the emulsion using the foregoing light source.

3. The method according to claim 1, wherein running the first and second processes includes using each of the first and second processes to cause storing of multiple wavelengths defining multiple numerical states with each wavelength representing a different number base two or higher.

4. The method according to claim 1, wherein the light source is non coherent and running the first and second processes includes using each of the first and second processes to cause the creation of interference patterns that are stored in the emulsion.

* * * * *